(12) United States Patent
Zhang

(10) Patent No.: US 11,322,719 B2
(45) Date of Patent: May 3, 2022

(54) ORGANIC LIGHT EMITTING DIODE COMPRISING INVERTED TRIANGULAR GROOVE STRUCTURE AT BOUNDARY LINE BETWEEN DISPLAY REGION AND NON-DISPLAY REGION AND METHOD OF FABRICATING THEREOF

(71) Applicant: WUHAN CHINA STAR OPTOELECTRONICS SEMICONDUCTOR DISPLAY TECHNOLOGY CO., LTD., Hubei (CN)

(72) Inventor: Xingyong Zhang, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 423 days.

(21) Appl. No.: 16/481,096

(22) PCT Filed: May 20, 2019

(86) PCT No.: PCT/CN2019/087582
§ 371 (c)(1),
(2) Date: Jul. 26, 2019

(87) PCT Pub. No.: WO2020/119025
PCT Pub. Date: Jun. 18, 2020

(65) Prior Publication Data
US 2021/0408451 A1    Dec. 30, 2021

(30) Foreign Application Priority Data
Dec. 14, 2018   (CN) .......................... 201811529423.7

(51) Int. Cl.
*H01L 51/52*    (2006.01)
*H01L 51/00*    (2006.01)
*H01L 51/56*    (2006.01)

(52) U.S. Cl.
CPC ...... *H01L 51/5253* (2013.01); *H01L 51/0097* (2013.01); *H01L 51/56* (2013.01); *H01L 2251/5338* (2013.01)

(58) Field of Classification Search
CPC . H01L 51/0097; H01L 51/5246; H01L 51/56; H01L 2251/5338
See application file for complete search history.

(56) References Cited

U.S. PATENT DOCUMENTS

2016/0329520 A1* 11/2016 Namkung ........... H01L 51/5253
2017/0229674 A1*  8/2017 Jin ..................... H01L 51/0097
(Continued)

FOREIGN PATENT DOCUMENTS

| CN | 106653818 A | 5/2017 |
| CN | 106784377 A | 5/2017 |
| CN | 108155218 A | 6/2018 |

*Primary Examiner* — Hoai V Pham

(57) ABSTRACT

An organic light emitting diode (OLED) device and the method of fabricating thereof. The OLED device includes a substrate, a display region, a non-display region, and an encapsulation structure covering the display region and the non-display region. The non-display region is composed of a flexible substrate that is bendable, the flexible substrate is curved toward a second surface of the substrate. The non-display region is provided with at least one groove structure at an edge adjacent to the display region, the groove structure extends along a first direction which is parallel to a boundary line between the display region and the non-display region.

13 Claims, 2 Drawing Sheets

(56) References Cited

U.S. PATENT DOCUMENTS

| | | |
|---|---|---|
| 2018/0315809 A1 | 11/2018 | Kim et al. |
| 2019/0140202 A1 | 5/2019 | Jin et al. |
| 2019/0237689 A1 | 8/2019 | Liu et al. |

* cited by examiner

ORGANIC LIGHT EMITTING DIODE COMPRISING INVERTED TRIANGULAR GROOVE STRUCTURE AT BOUNDARY LINE BETWEEN DISPLAY REGION AND NON-DISPLAY REGION AND METHOD OF FABRICATING THEREOF

CROSS REFERENCE TO RELATED APPLICATION

This application claims the priority of International Application No. PCT/CN2019/087582, filed on 2019 May 20, which claims priority to Chinese Application No. 201811529423.7, filed on 2018 Dec. 14. The entire disclosures of each of the above applications are incorporated herein by reference.

BACKGROUND OF INVENTION

Field of Invention

The present invention relates to the field of display technologies, and in particular, to an organic light emitting diode display and a method of fabricating thereof.

Description of Prior Art

In order to increase the screen ratio of an organic light emitting diode (OLED) display, that is, the ratio of an area of a display region to an area of a display screen, a bendable frame and a method of manufacturing thereof is proposed. The method needs to form deep holes in a non-display region of the display screen, then form metal traces and an organic layer, and then bend the non-display region downward to reduce an area of a projection of the non-display region on the display screen, thereby increasing the screen ratio.

Technical Problem

Usually, the organic layer in the bendable region is exposed to air and its surface is not encapsulated. This is because the inorganic film used for encapsulation has poor ductility and generates cracks when bent. If the cracks spread to the display region, the screen will be damaged. However, if the organic layer is directly exposed in air, the metal traces are easily corroded by water and oxygen and shortening the service life of the OLED display.

SUMMARY OF INVENTION

The present invention provides an organic light emitting diode (OLED) device and a manufacturing method of fabricating thereof to solve the technical problems that the encapsulation structure of the bent region of the OLED is prone to crack in the prior art.

Specifically, the present invention provides an organic light emitting diode (OLED) device, comprising: a substrate, a display region on a first surface of the substrate, a non-display region located at two sides of the display region, and an encapsulation structure covering the display region and the non-display region;

wherein the non-display region is composed of a flexible substrate that is bendable, the flexible substrate is curved toward a second surface of the substrate, the second surface is opposite to the first surface and is located on a back of the first surface;

wherein the non-display region is provided with at least one groove structure at an edge adjacent to the display region, the groove structure extends along a first direction which is parallel to a boundary line between the display region and the non-display region;

wherein the encapsulation structure comprises inorganic film covering the display region, the non-display region, and the groove structure;

wherein a depth of the groove structure is less than or equal to two-thirds of a thickness of the non-display region, a cross section of the groove structure in a second direction is an inverted triangle, the second direction is parallel to a direction in which the substrate is located and perpendicular to the first direction;

wherein a vertex of the inverted triangle is located at the boundary line between the display region and the non-display region.

According to one aspect of the invention, wherein a depth of the groove structure is less than or equal to two-thirds of a thickness of the non-display region, a cross section of the groove structure along the second direction is a positive trapezoid, and the second direction is parallel to a direction in which the substrate is located and perpendicular to the first direction;

wherein, the trapezoid is an isosceles trapezoid, and a symmetry axis of the trapezoid is located at the boundary line between the display region and the non-display region.

According to one aspect of the invention, wherein a number of the inorganic thin film is at least one, and a material of the inorganic thin film is any one of silicon nitride, silicon oxynitride, silicon carbonitride, silicon oxide and aluminum oxide.

According to one aspect of the invention, wherein the non-display region is a laminated structure, the laminated structure comprises:

an organic deep hole layer comprising deep holes extending through the substrate and filled with a flexible organic material for enhancing flexibility of the non-display region;

a metal layer located above the organic deep hole layer for forming metal traces having an electrical connection function;

a planarization layer over the metal layer for planarizing the metal layer; and support pillars located above the metal layer for supporting a mask which is used for forming a light-emitting layer.

According to one aspect of the invention, wherein a top of the non-display region is provided with at least one parallel groove structure, the at least one groove structure extends along the first direction which is parallel to the boundary line between the display region and the non-display region, a cross section of the at least one groove structure in the second direction is an inverted triangle, and the second direction is parallel to a direction in which the substrate is located and perpendicular to the first direction.

The present invention further provides an OLED device, comprising: a substrate, a display region on a first surface of the substrate, a non-display region located at two sides of the display region, and an encapsulation structure covering the display region and the non-display region;

wherein the non-display region is composed of a flexible substrate that is bendable, the flexible substrate is curved toward a second surface of the substrate, the second surface is opposite to the first surface and is located on a back of the first surface;

wherein the non-display region is provided with at least one groove structure at an edge adjacent to the display region, the groove structure extends along a first direction which is parallel to a boundary line between the display region and the non-display region;

wherein the encapsulation structure comprises inorganic film covering the display region, the non-display region, and the groove structure.

According to one aspect of the invention, a depth of the groove structure is less than or equal to two-thirds of a thickness of the non-display region, a cross section of the groove structure in a second direction is an inverted triangle, the second direction is parallel to a direction in which the substrate is located and perpendicular to the first direction;

wherein, a vertex of the inverted triangle is located at the boundary line between the display region and the non-display region.

According to one aspect of the invention, wherein a depth of the groove structure is less than or equal to two-thirds of a thickness of the non-display region, a cross section of the groove structure along the second direction is a positive trapezoid, and the second direction is parallel to a direction in which the substrate is located and perpendicular to the first direction;

wherein, the trapezoid is an isosceles trapezoid, and a symmetry axis of the trapezoid is located at the boundary line between the display region and the non-display region.

According to one aspect of the invention, wherein a number of the inorganic thin film is at least one, and a material of the inorganic thin film is any one of silicon nitride, silicon oxynitride, silicon carbonitride, silicon oxide and aluminum oxide.

According to one aspect of the invention, wherein the non-display region is a laminated structure, the laminated structure comprises:

an organic deep hole layer comprising deep holes extending through the substrate and filled with a flexible organic material for enhancing flexibility of the non-display region;

a metal layer located above the organic deep hole layer for forming metal traces having an electrical connection function;

a planarization layer over the metal layer for planarizing the metal layer; and support pillars located above the metal layer for supporting a mask which is used for forming a light-emitting layer.

According to one aspect of the invention, wherein a top of the non-display region is provided with at least one parallel groove structure, the at least one groove structure extends along the first direction which is parallel to the boundary line between the display region and the non-display region, a cross section of the at least one groove structure in the second direction is an inverted triangle, and the second direction is parallel to a direction in which the substrate is located and perpendicular to the first direction.

The present invention further provides a method of fabricating an OLED device, comprising the steps of:

providing a substrate;

forming a display region on a first surface of the substrate;

forming a non-display region at two sides of the display region, wherein the non-display region is composed of a flexible substrate that is bendable, the flexible substrate is curved toward a second surface of the substrate, the second surface is opposite to the first surface and is located on a back of the first surface; wherein the non-display region is provided with at least one groove structure at an edge adjacent to the display region, the groove structure extends along a first direction which is parallel to a boundary line between the display region and the non-display region;

forming an encapsulation structure covering the display region and the non-display region, the encapsulation structure comprises inorganic film covering the display region, the non-display region, and the groove structure.

According to one aspect of the invention, wherein a depth of the groove structure is less than or equal to two-thirds of a thickness of the non-display region;

wherein a cross section of the groove structure in a second direction is an inverted triangle, the second direction is parallel to a direction in which the substrate is located and perpendicular to the first direction; wherein, a vertex of the inverted triangle is located at the boundary line between the display region and the non-display region; or a cross section of the groove structure along a second direction is a positive trapezoid, and the second direction is parallel to the direction in which the substrate is located and perpendicular to the first direction; wherein, the trapezoid is an isosceles trapezoid, and a symmetry axis of the trapezoid is located at the boundary line between the display region and the non-display region.

According to one aspect of the invention, wherein the non-display region is a laminated structure, the laminated structure comprises:

an organic deep hole layer comprising deep holes extending through the substrate and filled with a flexible organic material for enhancing flexibility of the non-display region;

a metal layer located above the organic deep hole layer for forming metal traces having an electrical connection function;

a planarization layer over the metal layer for planarizing the metal layer; and support pillars located above the metal layer for supporting a mask which is used for forming a light-emitting layer.

According to one aspect of the invention, wherein a top of the non-display region is provided with at least one parallel groove structure, the at least one groove structure extends along the first direction which is parallel to the boundary line between the display region and the non-display region, a cross section of the at least one groove structure in a second direction is an inverted triangle, and the second direction is parallel to a direction in which the substrate is located and perpendicular to the first direction.

Beneficial Effects

The present invention provides at least one groove structure at an edge adjacent to the display region to confine creaks generated by the bending of an inorganic film so that the cracks will not expand toward the display region. Thereby, the bending region is protected while avoiding cracks. Meanwhile, the present invention further provides at least one parallel groove structure at the top of the non-display region to form wrinkles on the top of the display region. When bending, the wrinkles are flattened, thereby dissipating a part of the stress generated by the deformation of the bent region, so that the inorganic film is not easily broken as a protective layer.

DETAILED DESCRIPTION OF PREFERRED EMBODIMENTS

Figure 1:
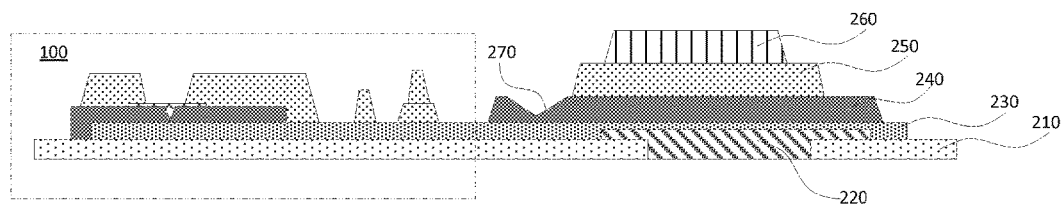
FIG. 1 is a structural diagram of an organic light emitting diode (OLED) device according to an embodiment of the present invention.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

The present invention provides an organic light emitting diode (OLED) device and a manufacturing method of fabricating thereof to solve the technical problems that the encapsulation structure of the bent region of the OLED is prone to crack in the prior art.

As shown in FIG. 1, the present invention provides an OLED device, comprising: a substrate 210, a display region 100 on a first surface of the substrate 210, a non-display region 100 located at two sides of the display region 100, and an encapsulation structure covering the display region 100 and the non-display region 100. The non-display region 100 is composed of a flexible substrate 210 that is bendable, the flexible substrate 210 is curved toward a second surface of the substrate 210, the second surface is opposite to the first surface and is located on a back of the first surface. The non-display region 100 is provided with at least one groove structure 270 at an edge adjacent to the display region 100, the groove structure 270 extends along a first direction which is parallel to a boundary line between the display region 100 and the non-display region 100. The encapsulation structure comprises inorganic film covering the display region 100, the non-display region 100, and the groove structure 270.

The non-display region 100 is a laminated structure, the laminated structure comprises: an organic deep hole layer comprising deep holes extending through the substrate 210 and filled with a flexible organic material for enhancing flexibility of the non-display region 100; a metal layer 230 located above the organic deep hole layer for forming metal traces having an electrical connection function; a first planarization layer 240 and a second planarization layer 250 over the metal layer 230 for planarizing the metal layer 230; and support pillars 260 located above the metal layer 230 for supporting a mask which is used for forming a light-emitting layer.

Figure 3:
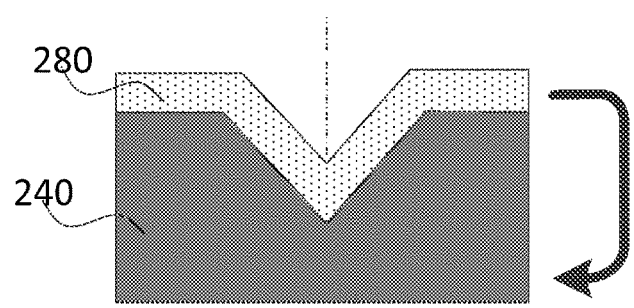
FIG. 3 is an enlarged structural diagram of the groove structure of FIG. 2.

As shown in FIG. 3, a depth of the groove structure 270 is less than or equal to two-thirds of a thickness of the non-display region 100, a cross section of the groove structure 270 in a second direction is an inverted triangle, the second direction is parallel to a direction in which the substrate 210 is located and perpendicular to the first direction. Wherein, a vertex of the inverted triangle is located at the boundary line between the display region 100 and the non-display region 100. The inverted triangular groove structure ensures that the cracks will be confined at a vertex position of the inverted triangle when bending and will not extend to the display region along the longitudinal direction of the device, thereby avoid affecting the encapsulation effect of the display region.

Figure 4:
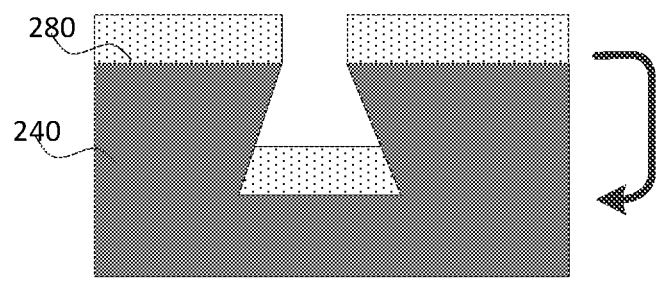
FIG. 4 is an enlarged structural diagram of a structure of a groove in another embodiment of the present invention.

As shown in FIG. 4, in another embodiment of the present invention, a cross section of the groove structure 270 along the second direction is a positive trapezoid, and the second direction is parallel to a direction in which the substrate 210 is located and perpendicular to the first direction. Wherein, the trapezoid is an isosceles trapezoid, and a symmetry axis of the trapezoid is located at the boundary line between the display region 100 and the non-display region 100. In the inorganic film formation process, the inner walls on two sides of the groove structure 270 are difficult to form a uniform film due to an excessive angle, and even impossible to form a film, so that inorganic film are formed only at the bottom of the groove structure 270. When bent, the bending position is the middle position of the bottom of the groove structure 270. Because the inner walls are not disposed with a film, when the inorganic film at the bottom of opening is cracked, the inorganic film on the top of the opening is still in a good condition, thereby ensuring the integrity of the inorganic film in the display region.

Figure 2:
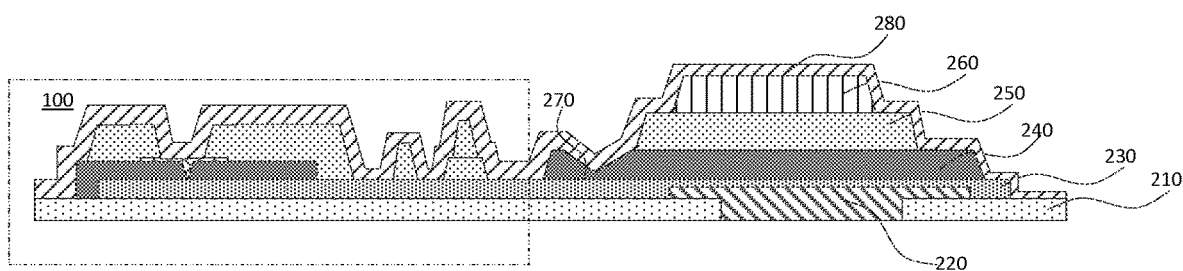
FIG. 2 is a structural diagram of an OLED device according to another embodiment of the present invention.

As shown in FIG. 2, FIG. 2 is a structural diagram of an OLED device according to another embodiment of the present invention. Wherein a number of the inorganic thin film 280 is at least one, and a material of the inorganic thin film is any one of silicon nitride, silicon oxynitride, silicon carbonitride, silicon oxide and aluminum oxide.

Figure 5:
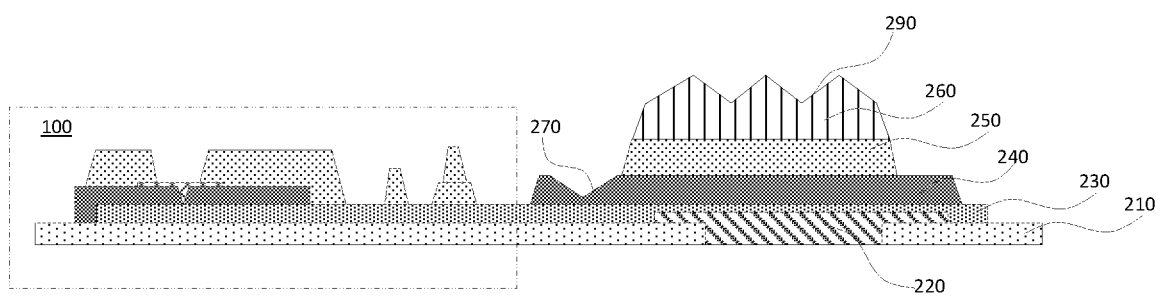
FIG. 5 is a structural diagram of an OLED device according to an embodiment of the present invention.

FIG. 5 is a structural diagram of an OLED device according to an embodiment of the present invention. Wherein a top of the non-display region 100 is provided with at least one parallel groove structure 290, the at least one groove structure 290 extends along the first direction which is parallel to the boundary line between the display region 100 and the non-display region 100, a cross section of the at least one groove structure 290 in the second direction is an inverted triangle, and the second direction is parallel to a direction in which the substrate 210 is located and perpendicular to the first direction. Because a surface of a top of the non-display region is jagged, the inorganic film is wrinkled. When bending, the wrinkled inorganic film is unfolded, thereby reducing the tensile stress caused by the deformation and making it difficult to creak.

The present invention further provides a method of fabricating an OLED device, including the steps of:

providing a substrate 210;

forming a display region 100 on a first surface of the substrate 210;

forming a non-display region 100 at two sides of the display region 100, wherein the non-display region 100 is composed of a flexible substrate 210 that is bendable, the flexible substrate 210 is curved toward a second surface of the substrate 210, the second surface is opposite to the first surface and is located on a back of the first surface; wherein the non-display region 100 is provided with at least one groove structure 270 at an edge adjacent to the display region 100, the groove structure 270 extends along a first direction which is parallel to a boundary line between the display region 100 and the non-display region 100;

forming an encapsulation structure covering the display region 100 and the non-display region 100, the encapsulation structure comprises inorganic film 280 covering the display region 100, the non-display region 100, and the groove structure 270.

The non-display region 100 is a laminated structure, the laminated structure comprises: an organic deep hole layer comprising deep holes extending through the substrate 210 and filled with a flexible organic material for enhancing flexibility of the non-display region 100; a metal layer 230 located above the organic deep hole layer for forming metal traces having an electrical connection function; a first planarization layer 240 and a second planarization layer 250 over the metal layer 230 for planarizing the metal layer 230; and support pillars 260 located above the metal layer 230 for supporting a mask which is used for forming a light-emitting layer.

In the present embodiment, wherein a depth of the groove structure 270 is less than or equal to two-thirds of a thickness of the non-display region 100. As shown in FIG. 3, a cross section of the groove structure 270 in a second direction is an inverted triangle, the second direction is parallel to a direction in which the substrate 210 is located and perpendicular to the first direction; wherein, a vertex of the inverted triangle is located at the boundary line between the display region 100 and the non-display region 100.

In another embodiment, as shown in FIG. 4, a cross section of the groove structure 270 along a second direction is a positive trapezoid, and the second direction is parallel to the direction in which the substrate 210 is located and perpendicular to the first direction; wherein, the trapezoid is an isosceles trapezoid, and a symmetry axis of the trapezoid is located at the boundary line between the display region 100 and the non-display region 100.

As shown in FIG. 5, FIG. 5 is a structural diagram of an OLED device according to an embodiment of the present invention. Wherein a top of the non-display region 100 is provided with at least one parallel groove structure 290, the at least one groove structure 290 extends along the first direction which is parallel to the boundary line between the display region 100 and the non-display region 100, a cross section of the at least one groove structure 290 in the second direction is an inverted triangle, and the second direction is parallel to a direction in which the substrate 210 is located and perpendicular to the first direction. Because a surface of a top of the non-display region is jagged, the inorganic film is wrinkled. When bending, the wrinkled inorganic film is unfolded, thereby reducing the tensile stress caused by the deformation and making it difficult to creak.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. An organic light emitting diode (OLED) device, comprising: a substrate, a display region on a first surface of the substrate, a non-display region located at two sides of the display region, and an encapsulation structure covering the display region and the non-display region;
    wherein the non-display region is composed of a flexible substrate that is bendable, the flexible substrate is curved toward a second surface of the substrate, the second surface is opposite to the first surface and is located on a back of the first surface;
    wherein the non-display region is provided with at least one groove structure at an edge adjacent to the display region, the groove structure extends along a first direction which is parallel to a boundary line between the display region and the non-display region;
    wherein the encapsulation structure comprises inorganic film covering the display region, the non-display region, and the groove structure;
    wherein a depth of the groove structure is less than or equal to two-thirds of a thickness of the non-display region, a cross section of the groove structure in a second direction is an inverted triangle, the second direction is parallel to a direction in which the substrate is located and perpendicular to the first direction; and
    wherein a vertex of the inverted triangle is located at the boundary line between the display region and the non-display region.

2. The OLED device according to claim 1, wherein a depth of the groove structure is less than or equal to two-thirds of a thickness of the non-display region, a cross section of the groove structure along the second direction is a positive trapezoid, and the second direction is parallel to a direction in which the substrate is located and perpendicular to the first direction; and
    wherein, the trapezoid is an isosceles trapezoid, and a symmetry axis of the trapezoid is located at the boundary line between the display region and the non-display region.

3. The OLED device according to claim 1, wherein a number of the inorganic thin film is at least one, and a material of the inorganic thin film is any one of silicon nitride, silicon oxynitride, silicon carbonitride, silicon oxide and aluminum oxide.

4. The OLED device according to claim 1, wherein the non-display region is a laminated structure, the laminated structure comprises:
    an organic deep hole layer comprising deep holes extending through the substrate and filled with a flexible organic material for enhancing flexibility of the non-display region;
    a metal layer located above the organic deep hole layer for forming metal traces having an electrical connection function;
    a planarization layer over the metal layer for planarizing the metal layer; and
    support pillars located above the metal layer for supporting a mask which is used for forming a light-emitting layer.

5. The OLED device according to claim 1, wherein a top of the non-display region is provided with at least one parallel groove structure, the at least one groove structure extends along the first direction which is parallel to the boundary line between the display region and the non-display region, a cross section of the at least one groove structure in the second direction is an inverted triangle, and the second direction is parallel to a direction in which the substrate is located and perpendicular to the first direction.

6. An organic light emitting diode (OLED) device, comprising: a substrate, a display region on a first surface of the substrate, a non-display region located at two sides of the display region, and an encapsulation structure covering the display region and the non-display region;
    wherein the non-display region is composed of a flexible substrate that is bendable, the flexible substrate is curved toward a second surface of the substrate, the second surface is opposite to the first surface and is located on a back of the first surface;
    wherein the non-display region is provided with at least one groove structure at an edge adjacent to the display region, the groove structure extends along a first direction which is parallel to a boundary line between the display region and the non-display region;
    wherein the encapsulation structure comprises inorganic film covering the display region, the non-display region, and the groove structure; and
    wherein a top of the non-display region is provided with at least one parallel groove structure, the at least one groove structure extends along the first direction which is parallel to the boundary line between the display region and the non-display region, a cross section of the at least one groove structure in the second direction is an inverted triangle, and the second direction is parallel to a direction in which the substrate is located and perpendicular to the first direction.

7. The OLED device according to claim 6, wherein a depth of the groove structure is less than or equal to two-thirds of a thickness of the non-display region, a cross section of the groove structure in a second direction is an inverted triangle, the second direction is parallel to a direction in which the substrate is located and perpendicular to the first direction; and wherein, a vertex of the inverted triangle is located at the boundary line between the display region and the non-display region.

8. The OLED device according to claim 6, wherein a depth of the groove structure is less than or equal to two-thirds of a thickness of the non-display region, a cross section of the groove structure along the second direction is a positive trapezoid, and the second direction is parallel to a direction in which the substrate is located and perpendicular to the first direction; and wherein, the trapezoid is an isosceles trapezoid, and a symmetry axis of the trapezoid is located at the boundary line between the display region and the non-display region.

9. The OLED device according to claim 6, wherein a number of the inorganic thin film is at least one, and a material of the inorganic thin film is any one of silicon nitride, silicon oxynitride, silicon carbonitride, silicon oxide and aluminum oxide.

10. The OLED device according to claim 6, wherein the non-display region is a laminated structure, the laminated structure comprises:

an organic deep hole layer comprising deep holes extending through the substrate and filled with a flexible organic material for enhancing flexibility of the non-display region;

a metal layer located above the organic deep hole layer for forming metal traces having an electrical connection function;

a planarization layer over the metal layer for planarizing the metal layer; and support pillars located above the metal layer for supporting a mask which is used for forming a light-emitting layer.

11. A method of fabricating an organic light emitting diode (OLED) device, comprising the steps of:

providing a substrate;

forming a display region on a first surface of the substrate;

forming a non-display region at two sides of the display region, wherein the non-display region is composed of a flexible substrate that is bendable, the flexible substrate is curved toward a second surface of the substrate, the second surface is opposite to the first surface and is located on a back of the first surface; wherein the non-display region is provided with at least one groove structure at an edge adjacent to the display region, the groove structure extends along a first direction which is parallel to a boundary line between the display region and the non-display region; and forming an encapsulation structure covering the display region and the non-display region, the encapsulation structure comprises inorganic film covering the display region, the non-display region, and the groove structure;

wherein a top of the non-display region is provided with at least one parallel groove structure, the at least one groove structure extends along the first direction which is parallel to the boundary line between the display region and the non-display region, a cross section of the at least one groove structure in a second direction is an inverted triangle, and the second direction is parallel to a direction in which the substrate is located and perpendicular to the first direction.

12. The method of fabricating an OLED device according to claim 11, wherein a depth of the groove structure is less than or equal to two-thirds of a thickness of the non-display region;

wherein a cross section of the groove structure in a second direction is an inverted triangle, the second direction is parallel to a direction in which the substrate is located and perpendicular to the first direction; wherein, a vertex of the inverted triangle is located at the boundary line between the display region and the non-display region; or a cross section of the groove structure along a second direction is a positive trapezoid, and the second direction is parallel to the direction in which the substrate is located and perpendicular to the first direction; wherein, the trapezoid is an isosceles trapezoid, and a symmetry axis of the trapezoid is located at the boundary line between the display region and the non-display region.

13. The method of fabricating an OLED device according to claim 11, wherein the non-display region is a laminated structure, the laminated structure comprises:

an organic deep hole layer comprising deep holes extending through the substrate and filled with a flexible organic material for enhancing flexibility of the non-display region;

a metal layer located above the organic deep hole layer for forming metal traces having an electrical connection function;

a planarization layer over the metal layer for planarizing the metal layer; and support pillars located above the metal layer for supporting a mask which is used for forming a light-emitting layer.

\* \* \* \* \*